United States Patent [19]
Roisen et al.

[11] Patent Number: 6,070,259
[45] Date of Patent: May 30, 2000

[54] DYNAMIC LOGIC ELEMENT HAVING NON-INVASIVE SCAN CHAIN INSERTION

[75] Inventors: Roger Roisen, Minnetrista; David B. Grover, Eden Prairie, both of Minn.

[73] Assignee: LSI Logic Corporation, Milpitas, Calif.

[21] Appl. No.: 09/007,407

[22] Filed: Jan. 15, 1998

[51] Int. Cl.[7] .................................................. G01R 37/28
[52] U.S. Cl. ........................................................ 714/726
[58] Field of Search .................................. 714/726, 727, 714/729, 724, 731

[56] References Cited

U.S. PATENT DOCUMENTS

| | | | |
|---|---|---|---|
| 5,130,647 | 7/1992 | Sakashita et al. | 371/22.36 |
| 5,229,999 | 7/1993 | Cushing et al. | 714/726 |
| 5,517,108 | 5/1996 | Kadowaki | 324/158.1 |
| 5,602,855 | 2/1997 | Whetsel, Jr. | 324/73.1 |
| 5,619,511 | 4/1997 | Sugisawa et al. | 714/30 |
| 5,642,362 | 6/1997 | Savir | 708/254 |
| 5,673,277 | 9/1997 | Amitai et al. | 371/22.31 |
| 5,701,309 | 12/1997 | Gearhardt et al. | 371/25.1 |
| 5,742,617 | 4/1998 | Warren | 714/727 |
| 5,757,820 | 5/1998 | Angelotti | 371/27.1 |
| 5,831,990 | 11/1998 | Queen et al. | 714/718 |
| 5,852,364 | 12/1998 | Whetsel | 326/16 |
| 5,881,068 | 3/1999 | Kim et al. | 714/726 |

OTHER PUBLICATIONS

R. Burgess, Jr.; P. Nagaraj; M. Waseq; The Boundary Scan; IEEE Potentials, vol. 14 3, pp.: 11–12, Aug./Sep., 1995.

DeHon, A.; In–System Timing Extracton and Control Through Scan–Based, Test–Access Ports; Test Conference; International Proceedings, 1994 pp. 350–359.

IEEE Standard Test Access Port and Boundary–Scan Architecture; Institute of the Electrical and Eolectronic Engineers, INc.; May 21, 1990.

T. Williams, *Tutorial #4 Dynamic Logic: Clocked and Asynchronous*, ISSCC 96 (1996).

*Primary Examiner*—Albert De Cady
*Assistant Examiner*—Jason Greene
*Attorney, Agent, or Firm*—Westerman, Champlin & Kelly, P.A.

[57] ABSTRACT

A scannable dynamic logic element includes a clock input, a test enable input, a data output, a precharge circuit, a boolean pull-down circuit and a test scan pull-down circuit. The precharge circuit is coupled between a first supply terminal and the data output and has a precharge control input coupled to the clock input. The boolean pull-down circuit is coupled between the data output and the second supply terminal and has a logic data input, a first evaluation control input which is coupled to the clock input and a first enable input which is coupled to the test enable input. The test scan pull-down circuit is coupled between the data output and the second supply terminal and has a test data input, a second evaluation control input which is coupled to the clock input and a second enable input which is coupled to the test enable input.

19 Claims, 4 Drawing Sheets

DYNAMIC LOGIC ELEMENT HAVING NON-INVASIVE SCAN CHAIN INSERTION

BACKGROUND OF THE INVENTION

The present invention relates to semiconductor integrated circuits and, more particularly, to integrated circuits having scannable dynamic logic elements and to a method of inserting a scan chain in a latch-less data path.

Semiconductor integrated circuits, such as application specific integrated circuits (ASICs), often incorporate thousands of semiconductor elements on a single chip. There are two primary types of digital circuits, static logic and dynamic logic. Static logic does not require periodic clock signals to maintain voltage levels at the various nodes within the circuit. Logical functions are typically separated by sequential elements, such as latches and other flip-flop devices, which define clock boundaries within individual signal paths. Dynamic logic data paths can be latch-less, and require periodic clock signals to maintain or refresh voltage levels. Dynamic logic circuits are usually faster and may consume more power than static logic circuits, but are more difficult to design and are more sensitive to timing errors and noise.

Once a digital circuit has been fabricated, the logical function and the timing of individual signal paths between the elements are tested according to a variety of test methodologies. One common test methodology for static logic is referred to as "scan testing". Scan testing is implemented by converting selected sequential elements into scannable elements by adding extra logic and a multiplexer. Each scannable element selects data from a normal data input or a test data input based on a test enable signal. The scannable elements are connected together to form a scan chain by connecting the output of each scannable element to the test data input of the next, subsequent scannable element in the chain.

When the test enable signal is activated, the scannable elements switch from the normal data flow mode to the scan mode. Each scannable element is controlled to select data from the test data input as opposed to the normal data input. A test vector is then loaded into the scannable elements by serially shifting the test vector through the scan chain. After the test vector is loaded, the test enable signal is deactivated and the scannable elements switch from the scan mode to the normal data flow mode. After a selected number of clock cycles, the test signal is again activated. The resulting data that is stored in each of the scannable elements forms an output vector which scanned out through the scan chain and compared with an expected output vector. Errors in the logical function or timing are detected by detecting discrepancies between the actual output vector and the expected output vector. One of the disadvantages of scan testing is that the extra logic required to implement the multiplexer function in each of the scannable elements adds at least a gate delay to the signal path.

With conventional dynamic logic, sequential elements such as registers and latches must be inserted into the data paths to create clock boundaries for the scan chain. However, the sequential elements also add delay to the data paths, which may negate the speed advantages of using dynamic logic.

SUMMARY OF THE INVENTION

The scannable dynamic logic element of the present invention includes a clock input, a test enable input, a data output, a precharge circuit, a boolean pull-down circuit and a test scan pull-down circuit. The precharge circuit is coupled between a first supply terminal and the data output and has a precharge control input coupled to the clock input. The boolean pull-down circuit is coupled between the data output and the second supply terminal and has a logic data input, a first evaluation control input which is coupled to the clock input and a first enable input which is coupled to the test enable input. The test scan pull-down circuit is coupled between the data output and the second supply terminal and has a test data input, a second evaluation control input which is coupled to the clock input and a second enable input which is coupled to the test enable input.

DETAILED DESCRIPTION OF THE PREFERRED EMBODIMENTS

Figure 1:
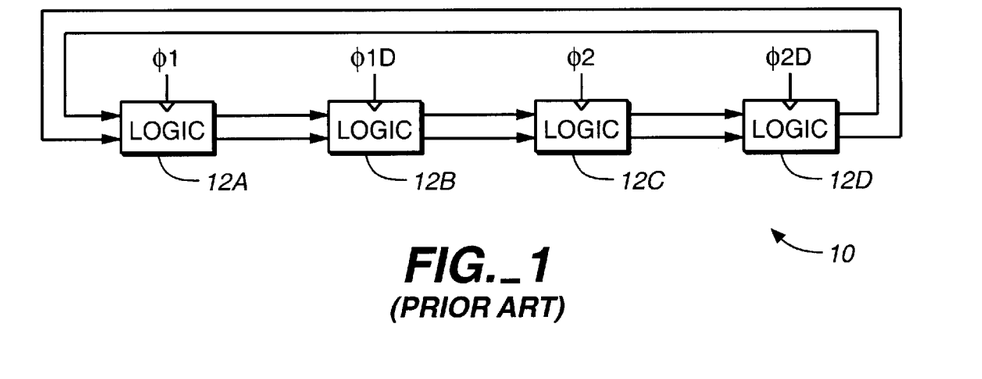
FIG. 1 is a schematic representation of a clocked four-phase dynamic logic data path.

FIG. 1 is a schematic representation of a dynamic logic data path 10. Data path 10 is divided logically into four groups, 12A–12D. Each group 12A–12D is clocked with a different clock phase. The dynamic logic elements in group 12A are clocked with clock signal φ1. The dynamic logic elements in group 12B are clocked with clock signal φ1D which is out of phase with clock signal φ1. The dynamic logic elements in group 12C are clocked with clock signal φ2 which is out of phase with clock signal φ1D. The dynamic logic elements in group 12D are clocked with clock signal φ2D which is out of phase with clock signal of φ2. Clock signals φ1, φ1D, φ2 and φ2D have the same clock period, but are out of phase with one another. Each group of dynamic logic elements 12A–12D evaluates the data on its inputs at the rising edge of the corresponding clock signal φ1, φ1D, φ2 and φ2D, and applies the result to the inputs of the following group for evaluation at the rising edge of the following clock phase. Other numbers of clock phases can also be used.

Figure 2:
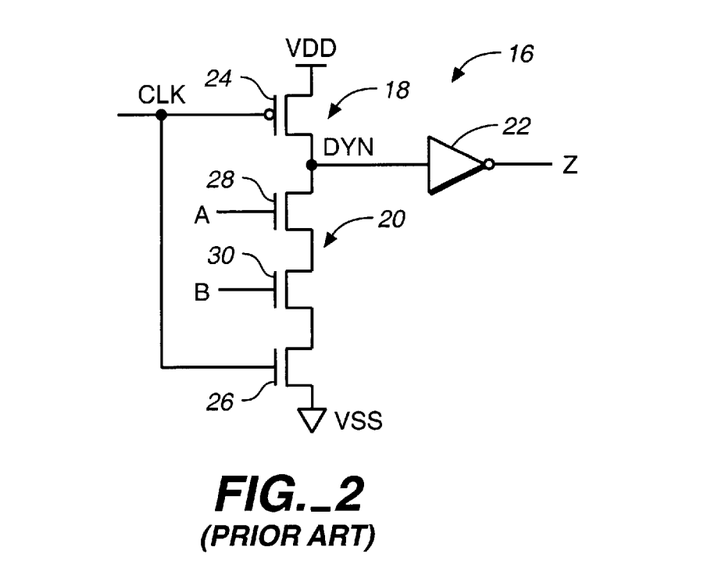
FIG. 2 is a schematic diagram of a typical dynamic logic element which implements a two-input AND gate function.

FIG. 2 is a schematic diagram of a typical dynamic logic element 16 which implements a boolean two-input AND function. Dynamic logic element 16 includes precharge circuit 18, boolean pull-down circuit 20 and inverter 22. Precharge circuit 18 includes a P-channel precharge transistor 24 having a gate coupled to clock input CLK, a source coupled to supply terminal VDD and a drain coupled to node DYN. Pull-down circuit 20 includes N-channel evaluation transistor 26 and N-channel logic transistors 28 and 30 which are coupled together in series between node DYN and voltage supply terminal VSS. The gate of evaluation transistor 26 is coupled to clock input CLK, and the gates of logic transistors 28 and 30 are coupled to data inputs A and B, respectively. Inverter 22 is coupled between node DYN and output terminal Z.

Clock input CLK is coupled to one of the clock signals, such as φ2, depending upon the logic group in which dynamic logic element 16 resides. When the clock signal on clock input CLK is low, precharge transistor 24 is on and precharges node DYN to a logic high level, toward the voltage on voltage supply terminal VDD. Evaluation transistor 26 is off and prevents logic transistors 28 and 30 from pulling node DYN low in response to data signals applied to data inputs A and B. On the rising edge of the clock signal, precharge transistor 24 turns off, removing the precharge on node DYN. Evaluation transistor 26 turns on, allowing evaluation of data inputs A and B. Node DYN stays high or falls low depending upon the logic state of the data signals applied to data inputs A and B. If both data signals are high, transistors 28 and 30 are both on and pull node DYN low. If either one of the data signals is low, node DYN remains high. Once node DYN is discharged, it will stay low until the next time the clock signal goes low, turning precharge transistor 24 back on. Inverter 22 drives subsequent dynamic logic stages and inverts the output so that, upon precharge, the data inputs to the subsequent stages remain low.

As shown in FIGS. 1 and 2, a typical dynamic logic data path can be latch-less. There are no static storage elements, such as latches or registers, in which to scan in test vectors. Traditional scan chain test methodologies are therefore difficult to implement in dynamic logic data paths without inserting a clock boundary.

Figure 3:
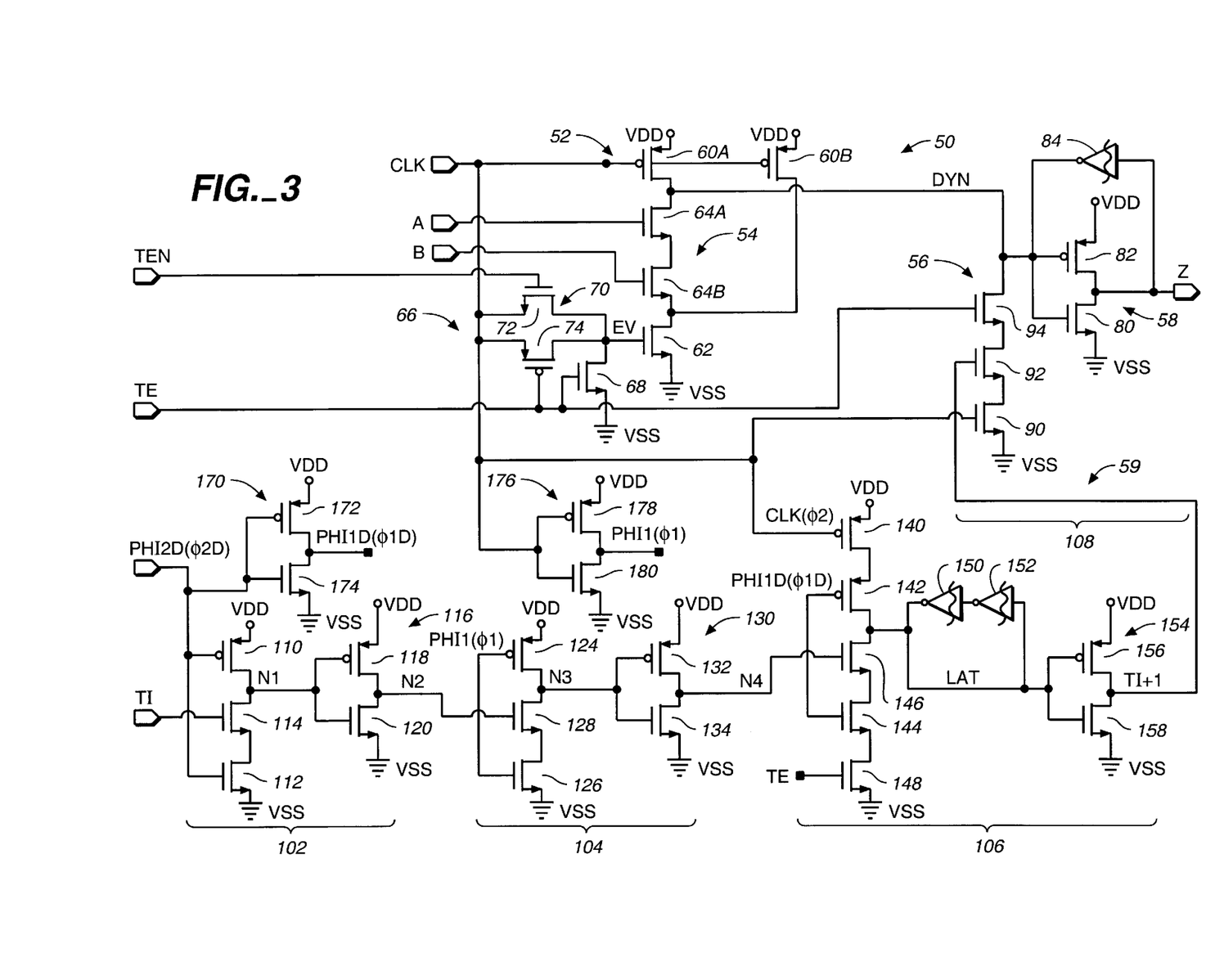
FIG. 3 is schematic diagram of a scannable dynamic logic element according to one embodiment of the present invention.

In accordance with the present invention, selected dynamic logic elements in the data path are converted to scannable elements and then connected together in series to create a scan chain. FIG. 3 is schematic diagram of a scannable dynamic logic element according to one embodiment of the present invention. Element 50 includes precharge circuit 52, boolean pull-down circuit 54, test scan pull-down circuit 56, inverter 58 and latch circuit 59. Precharge circuit 52 includes P-channel precharge transistors 60A and 60B. Boolean pull-down circuit 54 includes N-channel evaluation transistor 62 and N-channel logic transistors 64A and 64B. Precharge transistor 60A is coupled between voltage supply terminal VDD and node DYN, and has a gate coupled to clock input CLK. Precharge transistor 60B is coupled between voltage supply terminal VDD and the drain of evaluation transistor 62, and has a gate coupled to clock input CLK. Precharge transistor 60B is optional and is added to assist in precharging the drain of evaluation transistor 62.

Evaluation transistor 62 and logic transistors 64A and 64B are coupled together in series between node DYN and voltage supply terminal VSS. The gate of evaluation transistor 62 is coupled to clock input CLK, through test enable circuit 66. The gates of logic transistors 64A and 64B are coupled to data inputs A and B, respectively. Test enable circuit 66 includes N-channel pull-down transistor 68, N-channel transistor 72 and P-channel transistor 74. Pull-down transistor 68 has a gate coupled to test enable input TE, a source coupled to voltage supply terminal VSS and a drain coupled to the gate of evaluation transistor 62, at evaluation node EV. Transistors 72 and 74 are coupled between clock input CLK and evaluation node EV to form a transmission gate 70. The gate of transistor 72 is coupled to test enable input TEN, while the gate of transistor 74 is coupled to test input TE.

Test enable inputs TE and TEN receive complementary test enable signals. In a normal data flow mode, test enable input TE is low and test enable input TEN is high. Pull-down transistor 68 is therefore off and transistors 72 and 74 in transmission gate 70 are on such that clock signals received on clock input CLK pass through transmission gate 70 to evaluation node EV. In the normal data flow mode, the operation of precharge circuit 52 and boolean pull-down circuit 54 is substantially the same as that described with reference to FIG. 2. In test mode, test enable input TE is high and test enable input TEN is low. Transistors 72 and 74 turn off and prevent clock signals received on clock input CLK from reaching evaluation node EV. Pull-down transistor 68 turns on, pulling the gate of evaluation transistor 62 low. This prevents evaluation of data inputs A and B when the precharge is removed by precharge transistors 60A and 60B.

Test scan pull-down circuit 56 includes N-channel evaluation transistor 90, N-channel test data input transistor 92 and N-channel test enable transistor 94 which are coupled together in series between node DYN and voltage supply terminal VSS. The gate of evaluation transistor 90 is coupled to clock input CLK. The gate of test data input transistor 92 is coupled to test data input TI+1. The gate of test enable transistor 94 is coupled to test enable input TE.

Test data input transistor 92 receives test data from test data input TI+1. In the normal data flow mode, when test enable input TE is low, test enable transistor 94 is off and prevents node DYN from being pulled low through evaluation transistor 90 and test data input transistor 92. In test mode, when test enable input TE is high, test enable transistor 94 turns on allowing evaluation of the test data on the next rising edge of the clock signal applied to clock input CLK. If the test data on test data input TI+1 is low, test data input transistor 92 will be off and node DYN will remain in the precharged state. If the test data applied to test data input TI+1 is high, test data input transistor 92 will turn on and discharge node DYN through evaluation transistor 90.

Test enable inputs TE and TEN therefore act as multiplexer select lines for selecting boolean pull-down circuit 54 in the normal data flow mode or test scan pull-down circuit 56 in the test mode. Unlike scan features of the prior art, the scan features of the present invention do not add any gate delays to the dynamic logic elements. The scan features are simply added in another pull-down circuit, which is parallel with the boolean pull-down circuit. Also, test enable transistor 94 prevents test scan pull-down circuit 56 from interfering with the capacitive loading on node DYN during the normal data flow mode. This limits the need for designers to reevaluate a data path after the scan chain has been inserted into the data path.

Inverter 58 is coupled between node DYN and output terminal Z and includes N-channel transistor 80 and P-channel transistor 82 for driving output terminal Z. A weak inverting "keeper" transistor 84 is coupled between output terminal Z and node DYN. Keeper transistor 84 restores current lost on node DYN due to leakage through pull-down circuits 54 and 56 so dynamic logic element 50 can operate at slower clock frequencies or potentially with stopped clocks. Keeper transistor 84 can also assist in restoring charge to node DYN after occurrences of noise or charge-sharing events.

A scan chain is formed by connecting output Z of each scannable dynamic logic element to the test data input TI+1 of the next, subsequent scannable element in the chain. To prevent a "race" condition within the scan chain, each scannable dynamic logic element includes latch circuit 59 which is coupled in series with test data input TI+1. Alternatively, latch circuit 59 can be coupled in series with output Z of each scannable dynamic logic element. Latch circuit 59 is coupled between test data input TI and test data input TI+1. Test data input TI is coupled to the output terminal Z of the previous scannable element in the scan chain. Test data input TI+1 is coupled to the gate of test data input transistor 92. Latch circuit 59 essentially requires each test data bit in the test vector to step through each of the four clock phases before being shifted from the output of one scannable element to the next. This ensures that test data bits shift only one position along the scan chain for each clock cycle.

Latch circuit 59 includes three stages, stage 102, stage 104 and stage 106. A fourth stage 108 is formed by test scan pull-down circuit 56. Stages 102, 104, 106 and 108 correspond to the four phases of the clock signal for the embodiment shown in FIG. 3. Stage 102 is clocked by clock signal $\phi$2D, which is received on clock node PHI2D. Stage 104 is clocked by clock signal $\phi$01, which is received on clock node PHI1 and is out of phase with clock signal $\phi$2D. Stage 106 is clocked by clock signal $\phi$1D, which is received on clock node PHI1D and is out of phase with clock signal $\phi$1. Stage 108 is clocked by clock signal $\phi$2, which is received on clock input CLK and is out of phase with clock signal $\phi$1D.

Stage 102 includes P-channel precharge transistor 110, N-channel evaluation transistor 112, N-channel data input transistor 114 and inverter 116. Inverter 116 is formed by P-channel transistor 118 and N-channel transistor 120. Stage 102 functions as a dynamic logic element which buffers test data from test data input TI to node N2. At the rising edge of clock signal $\phi$2D, on clock node PHI2D, precharge transistor 110 turns off and evaluation transistor 112 turns on. Data input transistor 114 selectively discharges node N1 as a function of the test data received on test data input TI. Inverter 116 is coupled between nodes N1 and N2 and drives the data input of stage 104.

Stage 104 includes P-channel precharge transistor 124, N-channel evaluation transistor 126, N-channel data input transistor 128 and inverter 130. Inverter 130 is formed by P-channel transistor 132 and N-channel transistor 134. On the rising edge of clock signal $\phi$1, on clock node PHI1, precharge transistor 124 turns off and evaluation transistor 126 turns on. Data input transistor 128 selectively discharges node N3 as a function of the test data received on node N2. Inverter 130 is coupled between node N3 and node N4 and drives the data input of stage 106.

Stage 106 includes P-channel precharge transistors 140 and 142, N-channel evaluation transistor 144, N-channel data input transistor 146, N-channel test enable transistor 148, keeper transistors 150 and 152 and inverter 154. Inverter 154 is formed by P-channel transistor 156 and N-channel transistor 158. Precharge transistors 140 and 142 are coupled together in series between voltage supply terminal VDD and latch node LAT. Precharge transistor 140 is clocked by clock signal $\phi$2 which is received on clock input CLK, while precharge transistor 142 is clocked by clock signal $\phi$1D which is received on clock node PHI1D. Precharge transistors 140 and 142 precharge node LAT to a logic high level when clock signals $\phi$2 and $\phi$1D are both low. This effectively delays the precharging of latch node LAT, which lengthens the time at which data is stored on latch node LAT. Test enable transistor 148 prevents evaluation of the test data on node N4 during each clock cycle when test input TE is inactive, which reduces the charging and discharging of latch node LAT and thereby provides power savings to latch circuit 59.

In test mode, test enable input TE is active, and test enable transistor 148 is on. On the rising edge of clock signal $\phi$1D, on clock node PHI1D, precharge transistor 142 removes the precharge on latch node LAT, evaluation transistor 144 turns on, and data input transistor 146 selectively pulls node LAT low based on the test data applied to node N4. Inverter 154 is coupled between node LAT and test data input TI+1. Keeper transistors 150 and 152 form a feedback loop at node LAT for restoring charge lost through the pull-down circuit formed by transistors 144, 146 and 148.

Stages 102, 104, 106 and 108 shift individual bits of the test data one stage at a time with each subsequent phase of the clock signal. This prevents one bit of the test data from being scanned into multiple dynamic logic elements in the same clock cycle. Other latch circuits or scan delay elements can also be used with the present invention.

The various clock signals $\phi$1, $\phi$1D, $\phi$2, and $\phi$2D can be generated by a clock generator circuit (not shown) and globally routed to the respective dynamic logic elements. Alternatively, a single clock signal can be routed globally to each dynamic logic element and the individual clock phases can be generated as needed within each element through the use of inverters or other delay elements. In the embodiment shown in FIG. 3, clock signals $\phi$2 and $\phi$2D are routed as inputs to dynamic logic element 50. Clock signal $\phi$1D is generated by inverter 170 which is coupled between clock node PHI2D and clock node PHI1D. Inverter 170 includes P-channel transistor 172 and N-channel transistor 174. Clock signal $\phi$1 is generated by inverter 176 which is coupled between clock input CLK and clock node PHI1. Inverter 176 includes P-channel transistor 178 and N-channel transistor 180.

Figure 4:
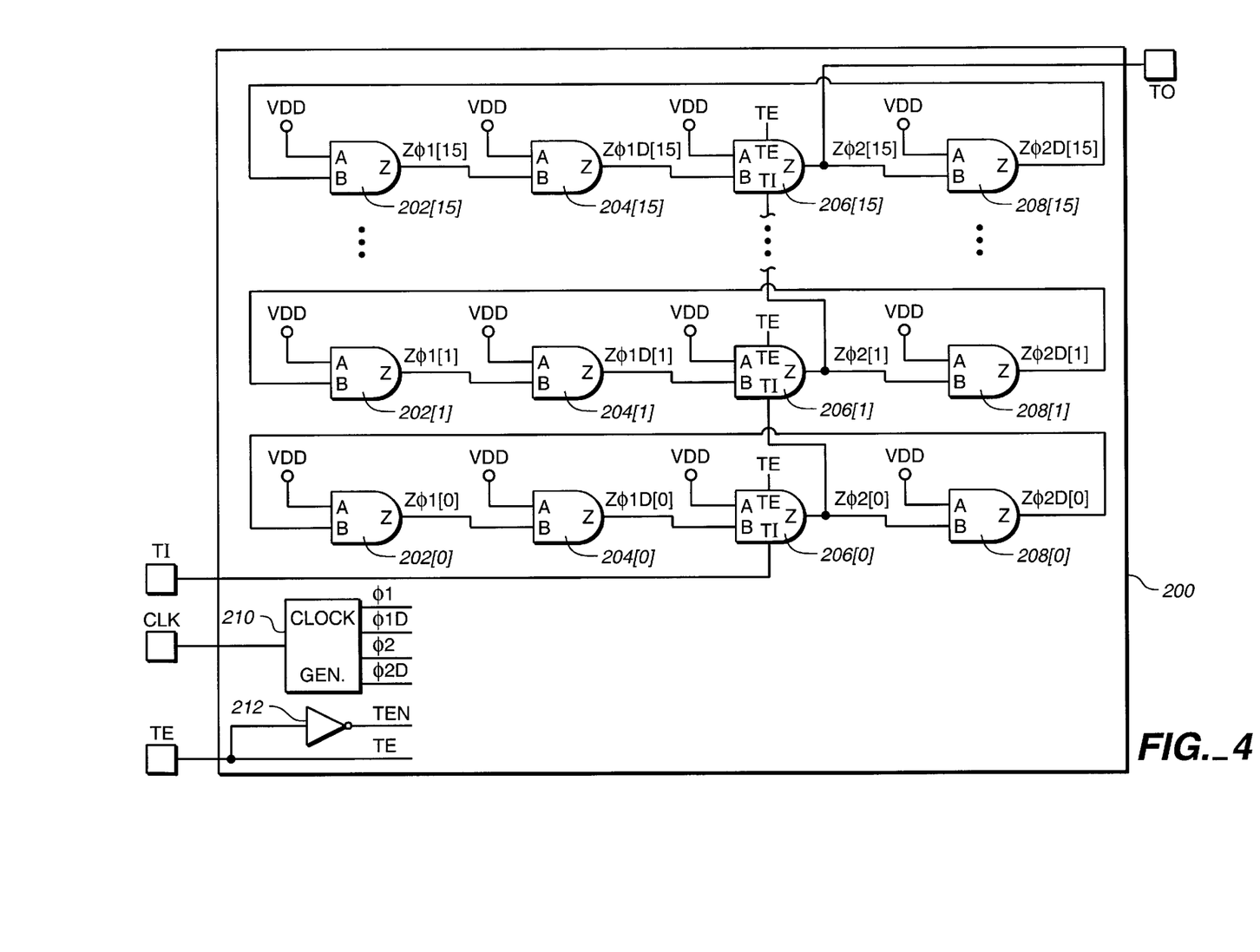
FIG. 4 is a diagram of an integrated circuit which illustrates a structure and method of scan chain insertion for dynamic logic in accordance with the present invention.

FIG. 4 is a diagram of an integrated circuit having a dynamic logic test circuit with scan chain insertion in accordance with the present invention. Integrated circuit 200 includes a matrix of dynamic logic, two-input AND gates 202 [0:15], 204 [0:15], 206 [0:15] and 208 [0:15]. AND gates 202 [0:15], 204 [0:15], 206 [0:15] and 208 [0:15] are coupled together to form sixteen parallel data paths, with each data path forming a serial loop. AND gates 202 [0:15] are clocked with clock signal $\phi$1. AND gates 204 [0:15] are clocked with clock signal $\phi$1D. AND gates 206 [0:15] are clocked with clock signal $\phi$2. AND gates 208 [0:15] are clocked with clock signal $\phi$2D. Data input A of each AND gate is coupled to voltage supply terminal VDD. Data input B of each AND gate is coupled to output Z, labeled Z$\phi$1[0:15], Z$\phi$1D [0:15], Z$\phi$2[0:15] and Z$\phi$2D [0:15], respectively, of the preceding AND gate in the loop.

A clock generator 210 is coupled to clock input CLK and generates clock signals $\phi$1, $\phi$1D, $\phi$2 and $\phi$2D which are routed to the various dynamic logic elements within integrated circuit 200.

AND gates 202 [0:15], AND gates 204 [0:15] and 208 [0:15] are traditional, non-scannable dynamic logic elements. AND gates 206 [0:15] are scannable dynamic logic elements similar to element 50 shown in FIG. 3. AND gates 206 [0:15] are coupled together in series to form a scan chain. Test input TI of AND gate 206 [0] is coupled to test input TI of integrated circuit 200. Output Z of AND gates 206 [0:14] are coupled to test inputs TI of AND gates 206 [1:15], respectively. Output Z of AND gate 206 [15] is coupled to test output TO of integrated circuit 200. Test enable input TE of integrated circuit is coupled to the test enable inputs TE (shown in FIG. 3) of scannable AND gates 206 [0:15]. Inverter 212 is coupled between test input TE of integrated circuit 200 and test inputs TEN (shown in FIG. 3) of scannable AND gates 206 [0:15].

Figure 5:
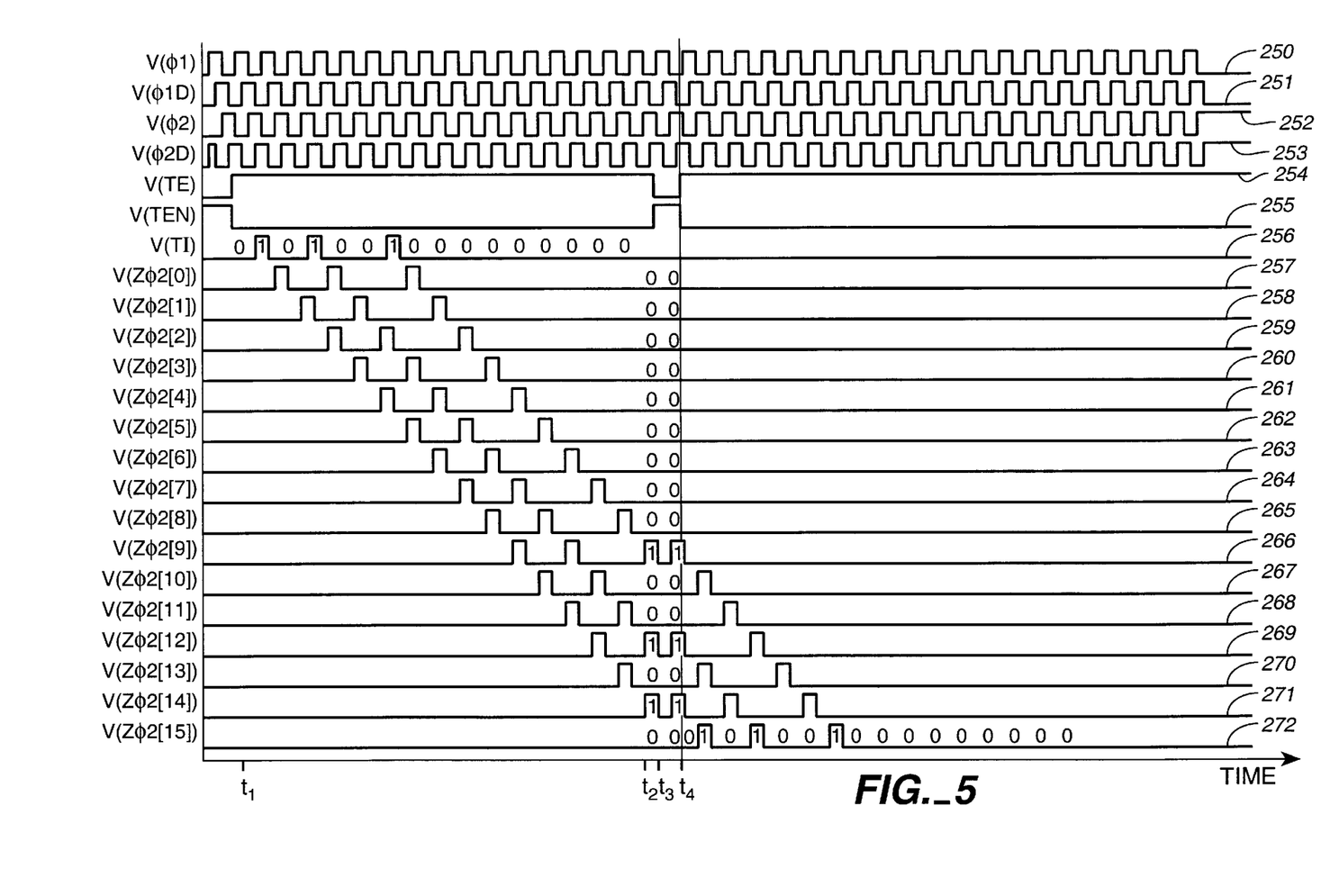
FIG. 5 is a waveform diagram illustrating the voltages over time on various nodes in the integrated circuit shown in FIG. 4.

FIG. 5 is a waveform diagram illustrating the voltages on various nodes in integrated circuit 200 over time. Waveforms 250–253 represent the voltages of clock signals $\phi$1, $\phi$1D, $\phi$2 and $\phi$2D, respectively. Waveforms 254 and 255 represent the voltages on test enable inputs TE and TEN, respectively. Waveform 256 represents the voltage on test input TI. Waveforms 257–272 represent the voltages on nodes Zφ2 [0:15], respectively.

At time T1, test enable inputs TE and TEN go active, placing the scannable AND gates 206 [0:15] in test mode. A 16-bit test vector 0101 0010 0000 0000 is serially applied to test input TI. The corresponding "0" and "1" bit values are labeled on waveform 256. Since AND gates 206 [0:15] are clocked with clock signal φ2, each rising edge of clock signal φ2 shifts the test vector one location in the scan chain formed by AND gates 206 [0:15]. At time T2, all 16 bits of the test vector are loaded into the corresponding AND gates 206 [0:15]. The corresponding bit values "0" and "1" that are stored in AND gates 206 [0:15] at time T2 are labeled on waveforms 257–272. At time T3, test enable inputs TE and TEN go inactive, placing AND gates 206 [0:15] in the normal data flow mode. Integrated circuit 200 runs for one complete clock cycle (through four clock phases), allowing the test data that was loaded into AND gates 206 [0:15] to propagate through AND gates 208 [0:15], 202 [0:15] and 204 [0:15] and then back to AND gates 206 [0:15].

At the end of the clock cycle, the bit values that are stored in AND gates 206 [0:15] form a test result vector. These bit values are labeled on waveforms 257–272 just prior to time T4. Since AND gates 202 [0:15], 204 [0:15], 206 [0:15] and 208 [0:15] are essentially buffers in the example shown in FIG. 4, the test result vector should equal the input vector applied to test input TI. An actual dynamic logic circuit will include a variety of dynamic logic elements which can perform a variety of logical functions. The test result vector will reflect the logical function performed by the circuit and the timing of individual data paths in the circuit.

At time T4, test enable inputs TE and TEN go active, placing AND gates 206 [0:15] in test mode. The test result vector stored in AND gates 206 [0:15] is then shifted serially through the scan chain to test output TO. The individual bits that are shifted through test output TO are labeled on waveform 271, from time T4 to time T5. The test result vector can then be compared with an expected test vector to verify the functional operation of the circuit.

The scan features of the present invention can be implemented in dynamic logic elements having logical functions other than the two-input AND gates shown in FIGS. 3 and 4. For example, the scan features can be implemented in an OR gate or any of a variety of more complex logical functions. These dynamic logic elements can have one boolean pull-down circuit or multiple boolean pull-down circuits. Each boolean pull-down circuit are selectively enabled based on a test enable signal. Also, the pull-down circuits can be enabled and disabled with a variety of alternative enable circuits, in addition to those shown in FIG. 3.

Although the present invention has been described with reference to preferred embodiments, workers skilled in the art will recognize that changes may be made in form and detail without departing from the spirit and scope of the invention. The present invention can be implemented with various technologies, including CMOS, and can have a variety of circuit configurations. The transistors shown in the figures can include individual transistors or an array of transistors coupled together in parallel with one another. Also, the voltage supply terminals can be relatively positive or relatively negative, depending upon the particular convention adopted and the technology used. The terms "pull-up" and "pull-down" used in the specification and the claims are arbitrary terms and can refer either to a logic high level or a logic low level depending upon the relative levels of the voltage supply terminals. Likewise, the term "coupled" can include various types of connections or couplings and can include a direct connection or a connection through one or more intermediate components.

What is claimed is:

1. A scannable dynamic logic element comprising:
   first and second supply terminals;
   a clock input;
   a test enable input;
   a data output;
   a precharge circuit coupled between the first supply terminal and the data output and having a precharge control input coupled to the clock input;
   a boolean pull-down circuit coupled between the data output and the second supply terminal and comprising a logic data input, a first evaluation control input which is coupled to the clock input and a first enable input which is coupled to the test enable input; and
   a test scan pull-down circuit comprising a test enable transistor, a test data input transistor and an evaluation transistor which are coupled together in series between the data output and the second supply terminal, wherein the test enable transistor has a control terminal, which is coupled to the test enable input, the test data input transistor has a control terminal, which forms a test data input, and the evaluation transistor has a control terminal, which forms a second evaluation control input and is coupled to the clock input.

2. The scannable dynamic logic element of claim 1 wherein the precharge circuit comprises a precharge transistor coupled between the first voltage supply terminal and the data output and having a control terminal coupled to the clock input.

3. The scannable dynamic logic element of claim 1 and further comprising an inverter coupled to the data output.

4. The scannable dynamic logic element of claim 1 and further comprising means for multiplexing the logic data input and the test data input to the data output as a function of a logic state of the test enable input.

5. The scannable dynamic logic element of claim 4 wherein:
   the test enable input has an active state and an inactive state; and
   the means for multiplexing enables the boolean pull-down circuit and disables the test scan pull-down circuit when the test enable input is in the inactive state and disables the boolean pull-down circuit and enables the test scan pull-down circuit when the test enable input is in the active state.

6. The scannable dynamic logic element of claim 1 wherein the boolean pull-down circuit comprises a logic transistor and an evaluation transistor which are coupled together in series between the data output and the second supply terminal, wherein the logic transistor comprises a control terminal which is coupled to the logic data input and wherein the evaluation transistor comprises a control terminal which forms the first evaluation control input.

7. The scannable dynamic logic element of claim 6 wherein the boolean pull-down circuit further comprises:
   a test enable circuit coupled between the clock input and the control terminal of the evaluation transistor and controlled by the first enable input.

8. The scannable dynamic logic element of claim 7 wherein the test enable circuit comprises:

a transmission gate transistor coupled in series between the clock input and the control terminal of the evaluation transistor and having a control terminal which forms the first enable input.

9. The scannable dynamic logic element of claim 8 wherein the test enable input further comprises a pull-down transistor coupled between the control terminal of the evaluation transistor and the second supply terminal and having a control terminal coupled to the control terminal of the transmission gate transistor.

10. The scannable dynamic logic element of claim 1 wherein the test enable transistor is coupled between the data output and the test data input transistor and wherein the evaluation transistor is coupled between the test data input transistor and the second supply terminal.

11. The scannable dynamic logic element of claim 1 and further comprising a latch circuit having a latch input for receiving test data and a latch output which is coupled to the test data input of the test scan pulldown circuit.

12. The scannable dynamic logic element of claim 11 wherein:

the clock input comprises N clock phase inputs for receiving N respective clock signals which are out of phase with one another, wherein N is a positive integer;

the first and second evaluation control inputs are coupled to one of the N clock phase inputs; and the latch circuit comprises N-1 dynamic logic buffers coupled together in series between the latch input and the latch output, wherein each dynamic logic buffer has a buffer clock input which is coupled to a respective one of the other N clock phase inputs.

13. A semiconductor integrated circuit comprising:

a test scan input;

a test scan output;

a test scan enable input;

a plurality of dynamic logic elements, wherein each dynamic logic element comprises a clock input, a logic data input and a data output and wherein a selected set of th e dynamic logic element s further comprise a test data input and a test enable input, wherein the data outputs and the test data inputs of the selected set of dynamic logic elements are coupled together in series to form a serial scan chain between the test scan input and the test scan output, wherein the test data input of a first of the selected dynamic logic elements in the scan chain is coupled to the test scan input and the data output of a last of the selected dynamic logic elements in the scan chain is coupled to the test scan output, and wherein the test enable inputs of the selected dynamic logic elements are coupled to the test scan enable input; and a plurality of dynamic logic latches, wherein each latch is coupled between the data output of a respective one of the selected dynamic logic elements and the test data input of the next, subsequent selected dynamic logic element in the scan chain.

14. The semiconductor integrated circuit of claim 13 and further comprising first and second supply terminals and wherein each of the selected dynamic logic elements further comprises:

a precharge circuit coupled between the first supply terminal and the data output and having a precharge control input coupled to the clock input;

a boolean pull-down circuit coupled between the data output and the second supply terminal and comprising the logic data input, a first evaluation control input which is coupled to the clock input and a first enable input which is coupled to the test enable input; and a test scan pull-down circuit coupled between the data output and the second supply terminal and comprising the test data input, a second evaluation control input which is coupled to the clock input and a second enable input which is coupled to the test enable input.

15. The semiconductor integrated circuit of claim 14 and further comprising means for multiplexing the logic data input and the test data input to the data output as a function of a logic state of the test enable input.

16. The semiconductor integrated circuit of claim 15 wherein:

the test enable input has an active state and an inactive state; and the means for multiplexing enables the boolean pull-down circuit and disables the test scan pull-down circuit when the test enable input is in the inactive state and disables the boolean pull-down circuit and enables the test scan pull-down circuit when the test enable input is in the active state.

17. The semiconductor integrated circuit of claim 14 wherein the boolean pull-down circuit comprises:

a logic transistor and an evaluation transistor which are coupled together in series between the data output and the second supply terminal, wherein the logic transistor comprises a control terminal which is coupled to the logic data input and wherein the first evaluation transistor comprises a control terminal which forms the first evaluation control input; and a test enable circuit coupled between the clock input and the control terminal of the first evaluation transistor and controlled by the first enable input.

18. The semiconductor integrated circuit of claim 14 wherein the test scan pull-down circuit comprises a test enable transistor, a test data input transistor and an evaluation transistor which are coupled together in series between the data output and the second supply terminal, wherein the test enable transistor has a control terminal which forms the second enable input, the test data input transistor has a control terminal coupled to the test data input, and the evaluation transistor has a control terminal which forms the second evaluation control input.

19. A method of inserting scan data into a dynamic logic element having a precharge circuit coupled between a first supply terminal and the data output and a boolean pull-down circuit coupled between the output and a second supply terminal, wherein the boolean pull-down circuit has a logic data input, and wherein the method comprises:

providing a test scan pull-down circuit comprising a test enable transistor, a test data input transistor and an evaluation transistor, which are coupled in series with one another between the data output and the second supply terminal, in parallel with the boolean pull-down circuit;

operating the dynamic logic element in a normal data flow mode and in a test mode;

enabling the boolean pull-down circuit and disabling the test scan pull-down circuit when the dynamic logic element is operated in the normal data flow mode;

disabling the boolean pull-down circuit and enabling the test scan pull-down circuit when the dynamic logic element is operated in the test mode;

applying logic data to the logic data input when the dynamic logic element is in the normal data flow mode; and applying scan data to the test data input transistor when the dynamic logic element is in the test mode and passing the scan data to the data output when the evaluation transistor and the test enable transistor are enabled.

* * * * *